(12) United States Patent  
Lamke et al.

(10) Patent No.: US 6,739,733 B1
(45) Date of Patent: May 25, 2004

(54) LED LAMP ASSEMBLY

(75) Inventors: Isadore I. Lamke, Washington, MO (US); Robert D. Plummer, St. Clair, MO (US); Michael E. Dinan, Beaufort, MO (US); Eugene P. Reinhold, Kirkwood, MO (US)

(73) Assignee: N.I.R., Inc., Washington, MO (US)

( * ) Notice: Subject to any disclaimer, the term of this patent is extended or adjusted under 35 U.S.C. 154(b) by 0 days.

(21) Appl. No.: 09/521,808

(22) Filed: Mar. 9, 2000

(51) Int. Cl.$^7$ .................................................. H01J 7/44
(52) U.S. Cl. ........................ 362/226; 362/800; 362/249; 362/267; 362/310
(58) Field of Search .................. 362/226, 545, 362/800, 267, 310, 235, 249, 240; 313/512

(56) References Cited

U.S. PATENT DOCUMENTS

| | | |
|---|---|---|
| 3,609,475 A | 9/1971 | Kaposhilin |
| 4,112,485 A | 9/1978 | Sutter |
| 4,380,793 A | 4/1983 | Potts |
| 4,733,335 A | 3/1988 | Serizawa et al. |
| 4,774,434 A | 9/1988 | Bennion |
| 4,779,166 A | 10/1988 | Tanaka et al. |
| 4,929,866 A | 5/1990 | Murata et al. |
| 4,954,931 A | 9/1990 | Hassler, Jr. |
| 5,008,782 A | 4/1991 | Murray |
| 5,193,895 A | 3/1993 | Naruke et al. |
| 5,241,457 A | 8/1993 | Sasajima et al. |
| 5,325,271 A | 6/1994 | Hutchisson |
| 5,390,092 A | 2/1995 | Lin |
| 5,463,280 A | 10/1995 | Johnson |
| 5,528,474 A | 6/1996 | Roney et al. |
| 5,632,551 A | * 5/1997 | Roney et al. ................ 362/249 |
| 5,806,965 A | * 9/1998 | Deese ......................... 362/249 |
| 5,821,695 A | * 10/1998 | Vilanilam et al. ............. 315/58 |
| 6,054,932 A | * 4/2000 | Gartner et al. .......... 340/815.65 |
| 6,276,822 B1 | * 8/2001 | Bedrosian et al. ........... 362/545 |
| 6,283,613 B1 | * 9/2001 | Schaffer ..................... 362/245 |
| 6,286,984 B1 | * 9/2001 | Berg ........................... 362/505 |

* cited by examiner

*Primary Examiner*—Sandra O'Shea
*Assistant Examiner*—Anabel Ton
(74) *Attorney, Agent, or Firm*—Polster, Lieder, Woodruff & Lucchesi, L.C.

(57) ABSTRACT

A lamp finding particular application in boat trailers and other vehicular applications is provided with a generally unbreakable lens structure. The lamp preferably is provided with a plurality of LEDS arranged with rows and columns on a circuit card or board. The lamp is constructed by encapsulating the board and LED arrangement in a moldable lens material, which after removal from a suitable mold at least partially defines the lamp housing.

18 Claims, 2 Drawing Sheets

LED LAMP ASSEMBLY

CROSS REFERENCE TO RELATED APPLICATIONS

None

STATEMENT REGARDING FEDERALLY SPONSORED RESEARCH OR DEVELOPMENT

Not Applicable

BACKGROUND OF THE INVENTION

This invention relates generally to lamps, and more specifically to vehicle lamps having an array of light emitting-diodes (LEDS) providing the light, and a structure and method of construction which produces a light structure which is relatively unbreakable and water resistant and/or water proof. While the invention is described in particular with its application in and to boat or other similar towed trailers, those skilled in the art will recognize the wider applicability of the inventive principles disclosed hereinafter.

One of the problems we have observed with respect to taillights of various boat trailers and other towed trailers for example, and with respect to vehicle lights in general, is the fact that the lights often become damaged. That is, it is not uncommon for a person who does not routinely tow a boat trailer, to experience problems in backing the boat trailer, for example. Often in backing, the taillight of the trailer becomes damaged. Likewise, boat trailers often are backed into water in order to load or unload a boat to be carried or carried by the trailer. Because prior art light assemblies are not waterproof, water entering the light assembly can and often does damage the electrical capabilities of the light. We have developed a relatively low-cost, water proof/resistant and relatively unbreakable back up and/or taillight and/or turning light, for example, that has wide application for vehicles, both driven and towed. In particular, we have found that a light can be molded completely from a suitable copolymer, poly-carbonate or acrylic plastic, and inserted in place of conventional taillights on trailers and vehicles, for example. Preferably, we employ light emitting diodes (LEDS) as the source of illumination for the light structure. The LEDS are mounted to a circuit card or board in any predetermined arrangement. The board and associated LEDS then are completely encapsulated during the manufacturing process.

While other lamp assemblies have employed LEDS in the past, the products of which we are aware did not provide a light structure which is relatively unbreakable alone or water proof/resistance in combination with the structure's other features. For purposes of this specification, relatively unbreakable means unbreakable in the environment of the lamp assembly's intended use during expected or normal operating conditions. For example, we have found that Spector Copolymer available from Eastman Chemical Company is an acceptable material for the lamp assembly of the present invention where the light assembly is intended for use in boat trailers. That material, in "sheet form," has an impact resistance at 32° F. of 93 lbs. per sq. inch (6 mm thick material) and 71 lbs. per sq. inch at 73° F. In boat trailer applications, the material thickness may approach one inch or more, for example, a thickness for which we were unable to find manufactures data. We have tested other polycarbonate material in prototype assemblies that has sustained 30 ft. lbs. force on the light assembly without damage (tested by dropping a five pound weight from a height of six feet). As indicated above, the preferred material for any particular application is one that does not suffer damage in it intended application during normal or intended operation of that application.

Among the devices of which we are aware which employ LEDS is one described in U.S. Pat. No. 5,632,551 ('551). While employing LEDS generically, the '551 patent describes the use of a conventional lens and an associated metal housing. While recognizing that breakage is a problem, the '551 patent attempts to solve that problem by recessing the lens member within the housing. While the invention described in the '551 may function well in some circumstances, it does not provide the simplified structure, water proof/resistance construction and true non breakable design for light assemblies available with our invention.

BRIEF SUMMARY OF THE INVENTION

One of the objects of this invention is to provide a low-cost lamp assembly;

Another of object of this invention is to provide a lamp assembly which is relatively unbreakable in applicational use.

Another object of this invention is to provide a lamp or light structure employing LEDS for the light source.

Another object of this invention is to provide an LED lamp structure in which the LEDS are arranged in rows and columns, the arrangement of which permits LEDS emitting various visible light colors to be employed in the light structure.

Yet another object of this invention is to provide a lamp structure which is directly replaceable with existing applications for similar lamps assemblies.

Another object of this invention is to provide a lamp structure which exhibits at least water resistance capabilities for preventing damage to electrical components of the structure.

Other objects will be apparent to those skilled in the art in light of the following description and accompanying drawings.

In accordance with this invention, generally stated, an unbreakable lamp finding particular application in automotive vehicle and trailers, for example is provided in which the lamp housing defines the lens and the housing itself Preferably, the lens is constructed from an unbreakable material, unbreakable being defined herein. The lamp includes a circuit board or card having a light unit associated with it. In the preferred embodiment, the light unit is a plurality of LEDS arranged in rows and columns. The light unit and the circuit board are encapsulated by the lens material. Encapsulation provides at least water resistance properties to the lamp assembly. The lens material is molded in a predetermined manner to provide the housing for the lamp assembly.

A method of constructing a lamp assembly in which the lens material defines a lamp housing also is disclosed.

BRIEF DESCRIPTION OF THE SEVERAL VIEWS OF THE DRAWINGS

The objects of the invention are achieved as set forth in the illustrative embodiments shown in the drawings, which form a part of the specification. In the drawings.

Corresponding reference characters indicate corresponding parts throughout the several views of the drawings.

DETAILED DESCRIPTION OF INVENTION

The following detailed description illustrates the invention by way of example and not by way of limitation. This description will clearly enable one skilled in the art to make and use the invention, and describes several embodiments, adaptations, variations, alternatives and uses of the invention, including what we presently believe is the best mode for carrying out the invention. It will nevertheless be understood that no limitation in the scope of the invention is thereby intended, and that alterations and further modifications of the illustrative devices are contemplated, including but not limited to such further applications of the principles of the invention illustrated herein as would normally occur to one skilled in the art to which this invention relates.

Figure 1:
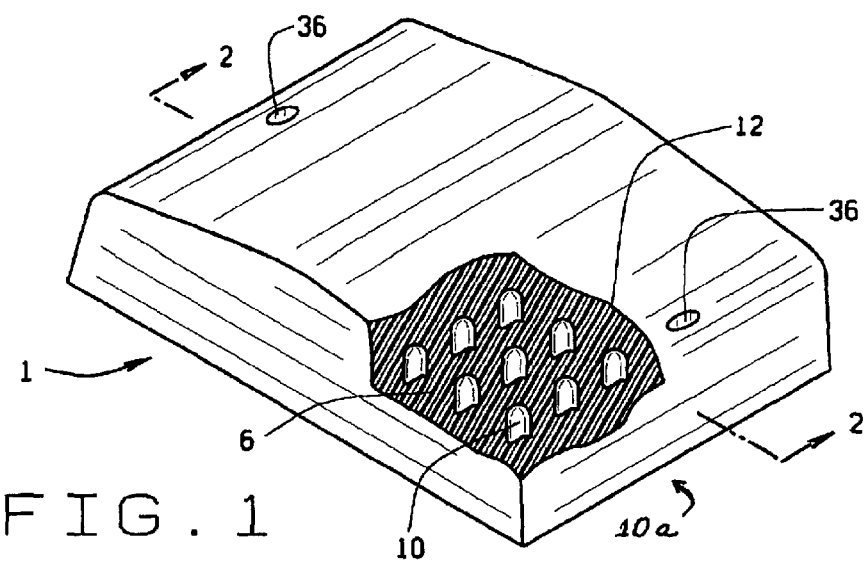
FIG. 1 is view in perspective, partly broken away, of one illustrative embodiment of lamp assembly of the present invention.

Referring now to FIG. 1, reference numeral 1 indicates one illustrative embodiment of lamp assembly of the present invention. The lamp assembly 1 includes a housing 4, which surrounds a circuit board or card 6, an electrical connection 8, and a light source 10a, preferably a plurality of LED lamps 10.

The circuit board 6 is conventional and is not described in detail. Circuit boards or cards used to hold various electrical components are well know in the art. In the embodiment illustrated, the card or board 6 has a plurality of LED lamps 10 mounted to it. The LEDS preferably are arranged in rows 12 and columns 14, as best seen in FIG. 1. Mounting or attachment of the LEDS to the board 6 likewise is conventional and is not described in detail Regardless of the attachment method, various arrangements of the LEDS are compatible with the broader aspects of the invention, and depend to some measure on the shape of the housing 4 and/or the intended use of the lamp assembly. For example, although a generally rectangular enclosure 4 as shown in the drawings, those skilled in the art will appreciate that other shapes, including round, elliptical, triangular, emblematic and the like may be employed in other embodiments of the invention. The configuration of the enclosure 4 will often determine the arrangement required or permitted the LEDS. Those skilled in the art also will recognize that the LEDS need not be arranged in rows and columns, in that a single LED may be employed in other applications of the invention.

Figure 2:
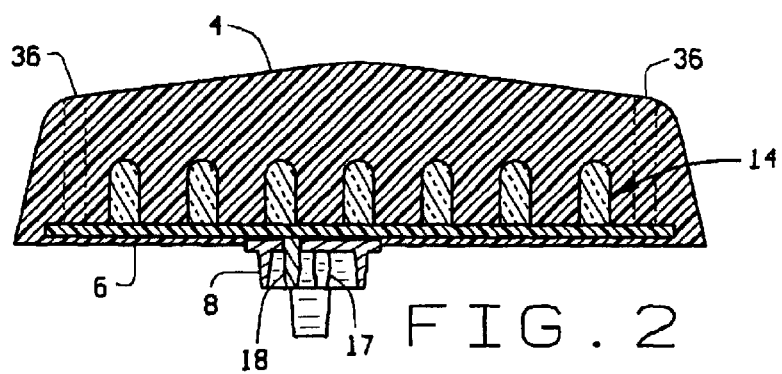
FIG. 2 is a sectional view taken along the line 2—2 of FIG. 1.
Figure 3:
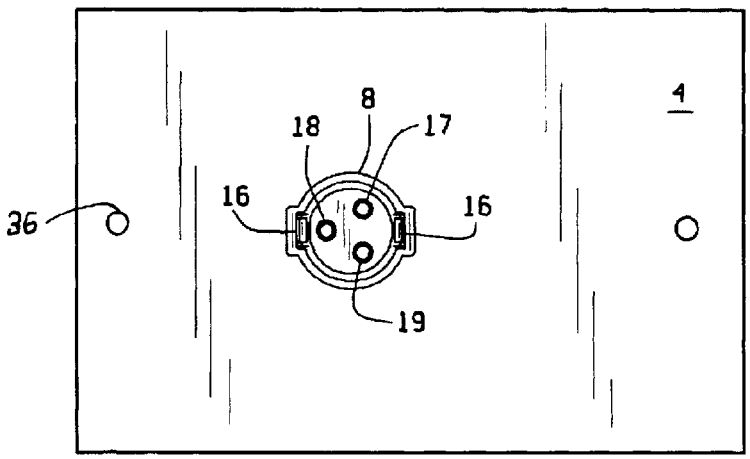
FIG. 3 is a rear plan view of the lamp assembly shown in FIG. 1.

The LEDS 10, as indicated, are mounted to the circuit board 6 in a conventional manner. The electrical connection 8 also is mounted to the circuit board 6 in a conventional manner, permitting the lamp assembly 1 to be inserted as a replacement for a more conventional taillight not shown, for example, of a boat trailer or a similar application. Connection 8 includes a pair of snap-in arms 16, and three power leads, 17, 18 and 19 respectively. The leads permit the LEDS to be operated in a number of ways, later described in greater detail. In the preferred embodiment, the electrical connection 8 is preassembled to the circuit board, and the electrical connections to the LEDS are made through the circuit board construction. In the alternative, individual electrical leads, not shown, may be brought out from the housing 4 for interconnection to a power source, likewise not shown. While a male connection is illustrated in FIG. 2, those skilled in the art will appreciate that a female or other interconnection form may be employed, if desired.

Our design is unique, for example, because the housing 4 also defines the lens and the body for the lamp assembly 1. Preferably, the housing 4 is constructed from relatively unbreakable material. Spector Copolymer available from Eastman Chemical Company is an acceptable material for the lamp assembly of the present invention where the light assembly is intended for use in boat trailers. As indicated above, that material, in sheet form, has an impact resistance at 32° F. of 93 lbs. per sq. inch (6 mm thick material) and 71 lbs. per sq. inch at 73° F. In boat trailer applications, the material thickness may approach one inch or more, for example, a thickness for which we were unable to find manufactures data. We have tested other poly-carbonate material in prototype assemblies that has sustained 30 ft. lbs. force on the light assembly without damage (tested by dropping a five pound weight from a height of six feet). Again, the preferred material for any particular application is one that does not suffer damage in its intended application during normal or intended operation of that application. In the context of this specification and invention, "unbreakable" has this meaning ascribed to it. The Spectar Copolymer material initially is flowable, and sets up to a final shape over some predetermined period of cure time. The method of cure may vary, depending on the material used to form the housing 4. For example, some material may cure in a satisfactory time merely with an ambient air cure. Other materials may require the application of heat to cure satisfactorily. Regardless of cure, however, all embodiments of the invention are designed so that the housing 4 encapsulates at least the LEDS 10 and circuit board 6, and arranged and formed to define the lens assembly for the lamp 1. That encapsulation, in turn, provides at least water resistance properties to the lamp assembly 1, since the material is impervious to liquid. If care is taken in the manufacturing process with the electrical connection to the circuit board 6, the lamp assembly 1 easily can be made to be water proof in the conventional sense of that term.

Figure 4:
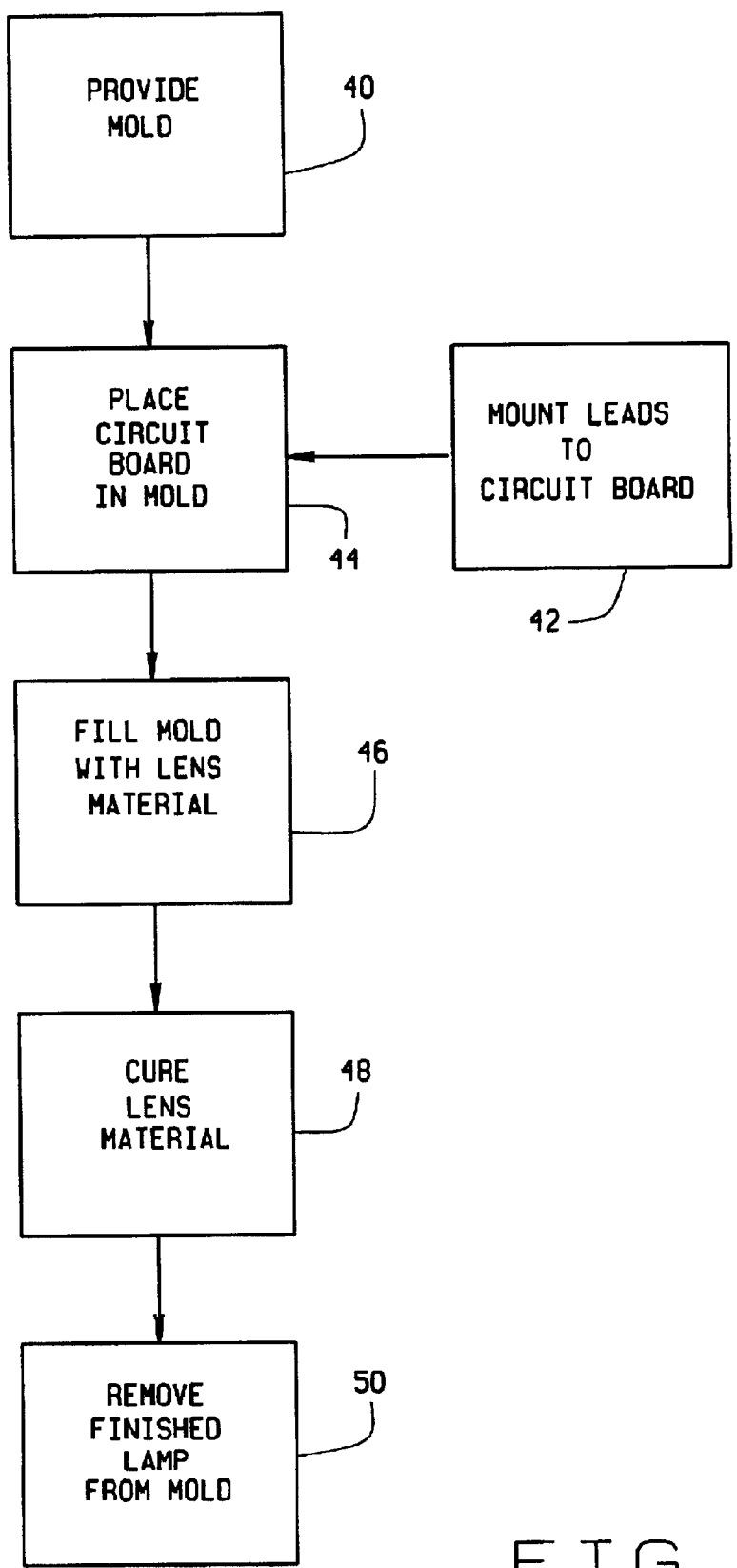
FIG. 4 is a block diagram of one illustrative method shown manufacturing the lamp assembly shown in FIGS. 1 through 3.

A preferred method of manufacture is shown in FIG. 4. A suitable mold 40 is constructed in a conventional method. The mold 40 is designed so that lamp assembly 1 has its intended shape upon removal from the mold. That is to say, the mold 40 is preformed so that the finished lamp assembly 1 may be extracted from the mold directly.

The LEDS are mounted to the circuit board 6 in a step 42. That combined assembly then is placed in the mold 40 in a step 44. As indicated above, preferably the electrical connection 8 is attached to the circuit board and inserted in the mold simultaneously with the circuit board and LEDS. However, the electrical connection may be made at a later time, if desired.

In the embodiment illustrated, the mold 40 also has provisions for providing one or more openings 36 through the enclosure. Alternatively, the openings 36 may be formed in the assembly 1 after removal from the mold. Those skilled in the art will recognize that the openings 36 may be eliminated in other embodiments of the invention. In any event, after placement of at least the LEDS and circuit board in the mold 40, the mold is filled with lens material to encapsulate the LEDS and circuit board completely, as illustratively shown in FIG. 2. Thereafter, the lens material is cured in a step 48 and the essentially finished product is removed from the mold in a step 50.

Because of the ease of manufacture, those skilled in the art will recognize that a number of attributes can be obtained with the lamp assembly 1 of the present invention. Merely by way of example, one or more of the rows 12 of the LEDS 10 may emit a different light spectrum from the remainder of the LEDS. Thus, certain of the LEDS may be arranged to provide a yellow arrow indicating a turning motion for the vehicle, while the remaining LEDS emit a light from the red spectrum indicating when the vehicle brakes are applied, for example. Likewise, the material forming the housing 4 may have a color pigment associated with it so that the enclosure 1 has a familiar red brake light configuration, if desired.

In view of the above, it will be seen that the several objects of the invention are achieved another advantageous results are obtained. As various changes could be made in the above constructions without departing from the scope of the invention, it is intended that all matter contained in the above description or shown in the accompanying drawings shall be interpreted as illustrative and not in a limiting sense. Numerous variations, within the scope of the appended claims, will be apparent to those skilled in the art in light of the foregoing description and accompanying drawings. For example, as indicated, the enclosure 1 may assume a variety of shapes. Other materials may be employed for the enclosure besides that described. The LED arrangement may vary in other embodiments of this invention. Likewise, the enclosure may be formed in a lens design, if desired. While the light assembly 1 is described as utilizing LEDS, other forms light emitting structures may be employed, if desired. Thus, conventional incandescent lamps or different unconventional sources of light may be employed in embodiments of the invention. LEDS presently are preferred because they offer low energy consumption and long life in applicational use. The light assembly 1 also may be attached to a second structure in a number of ways. Merely by way of example, while conventional threaded fasteners through suitable openings work well, the light assembly 1 may be bracket mounted, surface mounted, or recessed mounted in a friction fit, if desired. Applications of the light assembly 1 are numerous, and the description with respect to boat trailers is not to be construed in a limiting sense. In view of the above, it will be seen that the several objects and advantages of the present invention have been achieved and other advantageous results have been obtained.

Having thus described the invention, what is claimed and desired to be secured by Letters Patent is:

1. A lamp assembly including a housing, comprising:
    a support circuit board;
    a plurality of light emitting diodes mounted to said circuit board;
    an electrical connection attached to said circuit board and extending outwardly of said lamp assembly;
    a mold in place lens formed from material flowable about and encapsulating the circuit board and light emitting diodes to provide a one piece solid body about said circuit board and light emitting diodes; said solid body being formed into a predetermined shape defining said lamp assembly and lens, at least electrical leads of said electrical connection extending outwardly of said solid body to provide electrical connections for said lamp assembly, the housing and the lens being formed from the same material, the material defining the predetermined shape of the of the housing for the lamp assembly.

2. The lamp assembly of claim 1 wherein said LEDS are positioned and arranged in rows and columns.

3. The lamp assembly of claim 2 wherein at least one of said rows of LEDS emit light having a color different from at least another row of said LEDS.

4. The lamp assembly of claim 3 wherein said lens material has at least one opening formed in it for permitting attachment of said lamp assembly to another structure.

5. The lamp assembly of claim 3 wherein said electrical connection is integrally formed with said circuit board.

6. The lens assembly of claim 5 wherein said lens material has a color associated with it.

7. The lens assembly of claim 6 wherein the color is red.

8. The lens assembly of claim 7 wherein said lens assembly withstands a force of at least 30 ft.lbs.per square inch of force without damage.

9. A lamp assembly having a predetermined shape, comprising:
    a circuit board;
    a least one light emitting unit connected to said circuit board;
    an electrical connection attached to said light emitting unit; and
    a moldable lens formed from material completely encapsulating the circuit board and light emitting unit to form a solid one piece unit, said lens and said lamp assembly being constructed of the same material, said material defining the predetermined shape of said lamp assembly.

10. The lamp assembly of claim 9 wherein said light emitting unit comprises a plurality of light emitting diodes (LEDS).

11. The lamp assembly of claim 10 wherein said LEDS are positioned and arranged in rows and columns.

12. The lamp assembly of claim 11 wherein at least a portion of one of said rows of LEDS emits light having a color different from at least a portion of another row of said LEDS.

13. The lamp assembly of claim 12 wherein said lens material has at least one opening formed in it for permitting attachment of said lamp assembly to another structure.

14. The lamp assembly of claim 9 wherein said electrical connection is integrally formed with said circuit board.

15. The lamp assembly of claim 9 wherein said lens material has a color associated with it.

16. The lamp assembly of claim 15 wherein the color is red.

17. The lamp assembly of claim 9 wherein said lens material withstands a force of at least 30 ft.lbs.per square inch without damage.

18. A lamp assembly including a housing having a predetermined shape, comprising:
    a circuit board;
    at least one light emitting unit connected to said circuit board; and
    a lens formed from a moldable material, the material completely encapsulating the circuit board and light emitting unit so as to define a solid molded one piece lamp assembly unit, said material defining the predetermined shape of the housing for said lamp assembly, the housing and the lens being constructed of the same material, said material providing at least water resistance protection for the light emitting unit; and
    an electrical connection extending through the solid body of the lamp assembly, said electrical connection providing an electrical power path for connecting an external power source to said light emitting unit.

* * * * *